(12) United States Patent
Lai

(10) Patent No.: US 7,247,043 B2
(45) Date of Patent: Jul. 24, 2007

(54) LAND GRID ARRAY INTEGRATED CIRCUIT CONNECTOR

(76) Inventor: Kuang-Chih Lai, No.2, Lane 10, Shengli St., Tucheng City, Taipei County 236 (TW)

( * ) Notice: Subject to any disclaimer, the term of this patent is extended or adjusted under 35 U.S.C. 154(b) by 0 days.

(21) Appl. No.: 11/271,874

(22) Filed: Nov. 14, 2005

(65) Prior Publication Data
US 2006/0286827 A1 Dec. 21, 2006

(30) Foreign Application Priority Data
Jun. 3, 2005 (TW) .............................. 94118356 A

(51) Int. Cl.
H01R 13/62 (2006.01)
(52) U.S. Cl. ...................................... 439/331
(58) Field of Classification Search ................. 439/71, 439/70, 331, 802
See application file for complete search history.

(56) References Cited

U.S. PATENT DOCUMENTS

| | | | | |
|---|---|---|---|---|
| 5,917,703 A * | 6/1999 | Murphy | ........................ | 361/704 |
| 6,123,552 A * | 9/2000 | Sakata et al. | .................. | 439/71 |
| 6,208,155 B1 * | 3/2001 | Barabi et al. | ................ | 324/754 |
| 6,572,397 B2 * | 6/2003 | Ju | .............................. | 439/342 |
| 6,731,516 B1 * | 5/2004 | Ma | ............................. | 361/802 |
| 6,735,085 B2 * | 5/2004 | McHugh et al. | ............. | 361/719 |
| 6,799,978 B2 * | 10/2004 | Ma et al. | ....................... | 439/73 |
| 6,827,587 B2 * | 12/2004 | Ma | ............................... | 439/73 |
| 6,875,038 B1 * | 4/2005 | McHugh et al. | ............ | 439/331 |
| 6,877,990 B2 * | 4/2005 | Liao et al. | ..................... | 439/41 |
| 6,908,316 B2 * | 6/2005 | Ma et al. | ....................... | 439/73 |
| 6,908,327 B2 * | 6/2005 | Ma | .............................. | 439/331 |
| 6,929,495 B2 * | 8/2005 | Ma | .............................. | 439/331 |
| 6,932,622 B2 * | 8/2005 | Liao et al. | ..................... | 439/73 |
| 6,957,973 B1 * | 10/2005 | McHugh et al. | ............ | 439/331 |

* cited by examiner

Primary Examiner—Tulsidas C. Patel
Assistant Examiner—Harshad C Patel
(74) Attorney, Agent, or Firm—Birch, Stewart, Koasch & Birch, LLP

(57) ABSTRACT

A land grid array integrated circuit (LGA IC) connector uses a pressing rod assembly linked with a cover for opening/closing operation. The LGA IC connector includes a first tooth and a second tooth driven by a first post and a second post of a positioning section to enhance the rotation angle thereof. A sufficient pressure can be provided with smaller operation angle of the pressing rod and cover, thus facilitating operation. A protection board is assembled to the terminal stage and then arranged on a frame. A V-shaped spring element is provided between the protection board and the terminal stage such that the protection board is higher than the terminal to protect the terminal. The terminal can be protected from deformation. In the present invention, the terminal is received in the terminal hole and the annular cone at terminal tail can clamp the solder ball.

10 Claims, 19 Drawing Sheets

LAND GRID ARRAY INTEGRATED CIRCUIT CONNECTOR

BACKGROUND OF THE INVENTION

1. Field of the Invention

The present invention relates to a land grid array integrated circuit (LGA IC) connector, especially to a LGA IC connector with a pressing rod linked with a cover to easily open/close the cover with small operation angle between the cover and the pressing, the LGA IC connector further comprising terminal with annular cones on tail thereof to clamp solder ball and V-shaped spring element to protect the terminal with the protection board.

2. Description of Prior Art

As shown in FIG. 21, the IC connector in LGA package comprises frame and terminal stage, The terminal 2 in the terminal stage is electrically connected to the thin conductor on bottom of IC 3 and circuit board 4. The tail of the terminal 2 is connected to the circuit board 4 through solder ball. The frame is assembly comprises a frame 5, a cover 6, and a pressing rod 7. The first wall 8 of the frame 5 comprises a locking hole 9 for pressing the cover 6. The pressing rod 7 comprises a crank 12 and the cover 6 comprises a locking tab 13 corresponding to the crank 12. The third wall 14 of the frame 5 comprises a hook 15 and the pressing rod 11 is locked in the hook 15. The cranks 12 locks the locking tab 13 to press downward the IC 3 and act on the terminal 2 for conduction. However, the pressing rod is not linker with the cover and they need alternative operation during assembling the IC. The assembling is not convenient and the exposed terminal is liable to deform.

SUMMARY OF THE INVENTION

In one aspect, the present invention provides a linking structure for a pressing rod and a cover and providing angle change between the pressing rod and the cover. A sufficient pressure strobe and an opening angle can be provided for an LGA IC connector.

In another aspect, the present invention provides an LGA IC connector with easy operation and ability to fix the terminal to a frame.

In still another aspect, the present invention provides a terminal to clamp solder ball on tail thereof.

In still another aspect, the present invention provides a terminal with a thin section and a tapered section on a swing portion thereof to increasing swing and contact effect.

In still another aspect, the present invention provides an LGA IC connector with a V-shaped spring element between a protection board and a terminal stage such that the protection board floats atop the terminal to protect the terminal.

In still another aspect, the present invention provides a protection board having through hole with bevel to guide terminal.

Preferably, the LGA IC connector according to the present invention comprises a frame, a cover and a pressing rod assembly connecting the frame and the cover. The frame comprises a positioning section with a first post and a second post. The cover comprises a third shaft at a first end thereof and the third shaft comprises a first tooth and a third tooth. When the pressing rod is released, a crank of the pressing rod moves the cover and the second tooth of the third shaft to the second post, the opening angle of the cover is increased until the crank abuts the top of the second post. The cover can be opened with larger angle without rotating the cover in great extent. To close the cover, the pressing rod is operated to a closing direction. The first tooth of the third shaft is moved by the first post of the positioning section. The cover can be closed with small operation angle of the pressing rod.

Preferably, the LGA IC connector according to the present invention comprises a terminal stage with a first wall and a second wall. The first wall comprises a first clamping groove and a second clamping groove, the second wall comprising a third clamper and a fourth clamper. The LGA IC connector further comprises a frame with a bottom plate. The bottom plate comprises a hollow and a first locker and a second locker being arranged at a first end of the hollow, a third locker and a fourth locker being formed at the second end of the hollow. The locking points of the lockers have height difference with the bottom plate such that the thickness and strength of the clamping groove can be enhanced. The third locker and the fourth locker have resilient horizontal swing. The guiding bevel of the third locker and the fourth locker enable the terminal stage to lock into the frame.

Preferably, the terminal stage comprises a plurality of terminal holes and each of the terminal holes containing a terminal with an annular cone on soldering end thereof. A plurality of conic teeth is formed on top of the annular cone. The solder ball can be stabbed by the conic teeth when the solder ball is loaded. The opening of the conic teeth can be shrunk to clamp the solder ball.

Preferably, the terminal comprises thin section and tapered section on swing portion thereof to increase swing degree and contact effect without increasing length of the swing portion.

Preferably, the LGA IC connector according to the present invention comprises a protection board and a terminal stage fit into a frame after assembling. The protection board comprises a first end wall and a second end wall with two tenons fit into clamping grooves on the terminal stage. The protection board comprises a plurality of through holes and dents containing a plurality of spring elements to provide a movable strobe for the protection board and the terminal stage, wherein each dent is corresponding to one tenon. The action force is at the tenon when the protection board is lifted by the spring element to prevent the thermal warp of the protection board. The spring element is of V shape and has symmetrical spring point to protect the terminal with the protection board.

Preferably, the protection board comprises a plurality of guiding bevels to ensure precise contact position when the terminal is extended out of the through hole. A preload pressure is generated when the terminal is extended out of the through hole to increase friction effect.

BRIEF DESCRIPTION OF DRAWING

The features of the invention believed to be novel are set forth with particularity in the appended claims. The invention itself however may be best understood by reference to the following detailed description of the invention, which describes certain exemplary embodiments of the invention, taken in conjunction with the accompanying drawings in which:

DETAILED DESCRIPTION OF THE INVENTION

Figure 1:
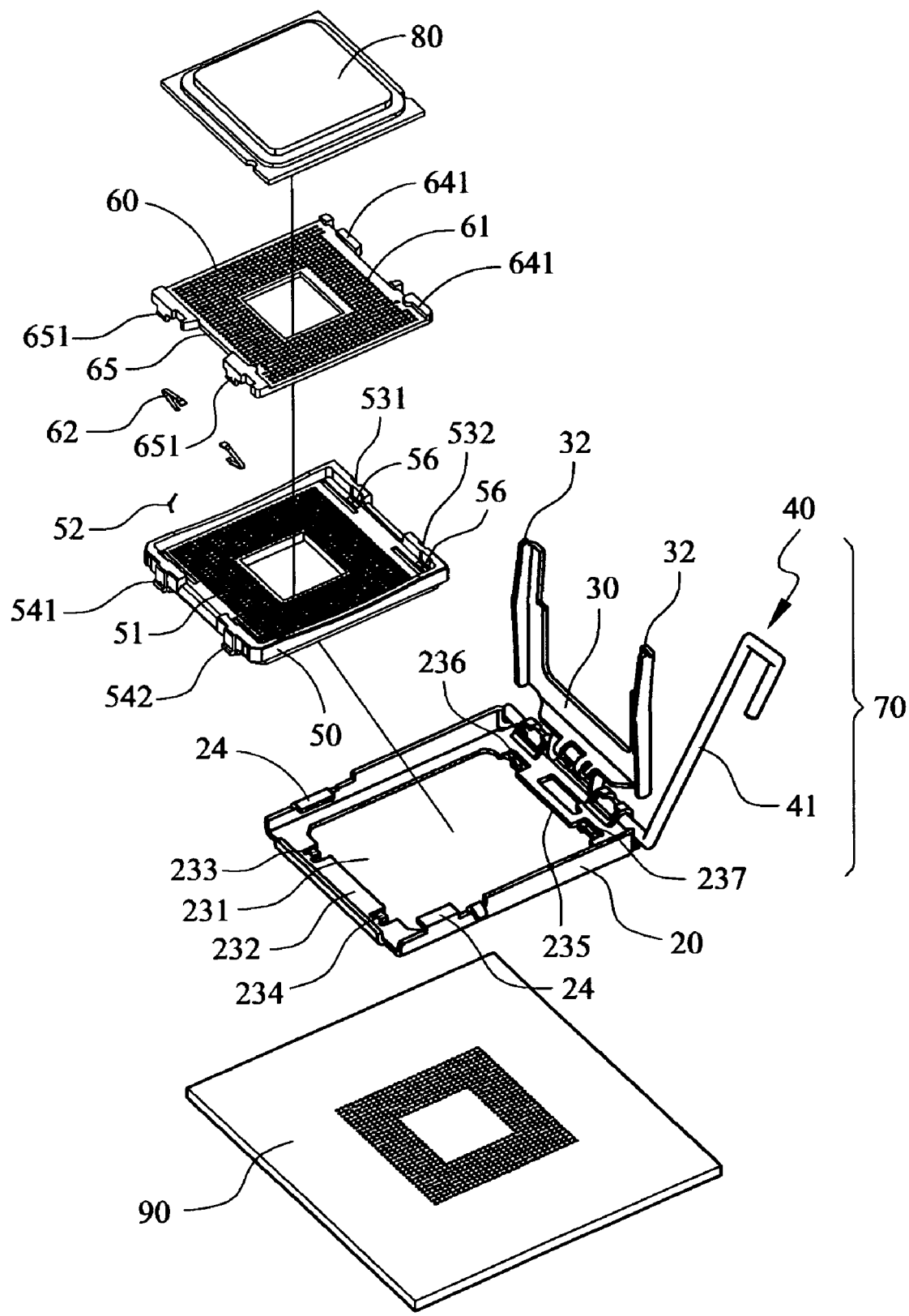
FIG. 1 shows an exploded view of the LGA IC connector according to the present invention.

FIG. 1 shows an exploded view of the LGA IC connector according to the present invention. The LGA IC connector according to the present invention comprises an IC 80, a protection board 60, a terminal stage 50 and a frame assembly 70. The protection board 60 is arranged on the terminal stage 50 and the assembled terminal stage 50 is arranged in a frame 20 of the frame assembly 70 such that the terminal 52 in the terminal stage 50 can be electrically connected to a circuit board 90. The IC 80 is then placed into the terminal stage 50 in the frame 20 whereby the terminal 52 can be electrically connected to the IC 80.

Figure 2:
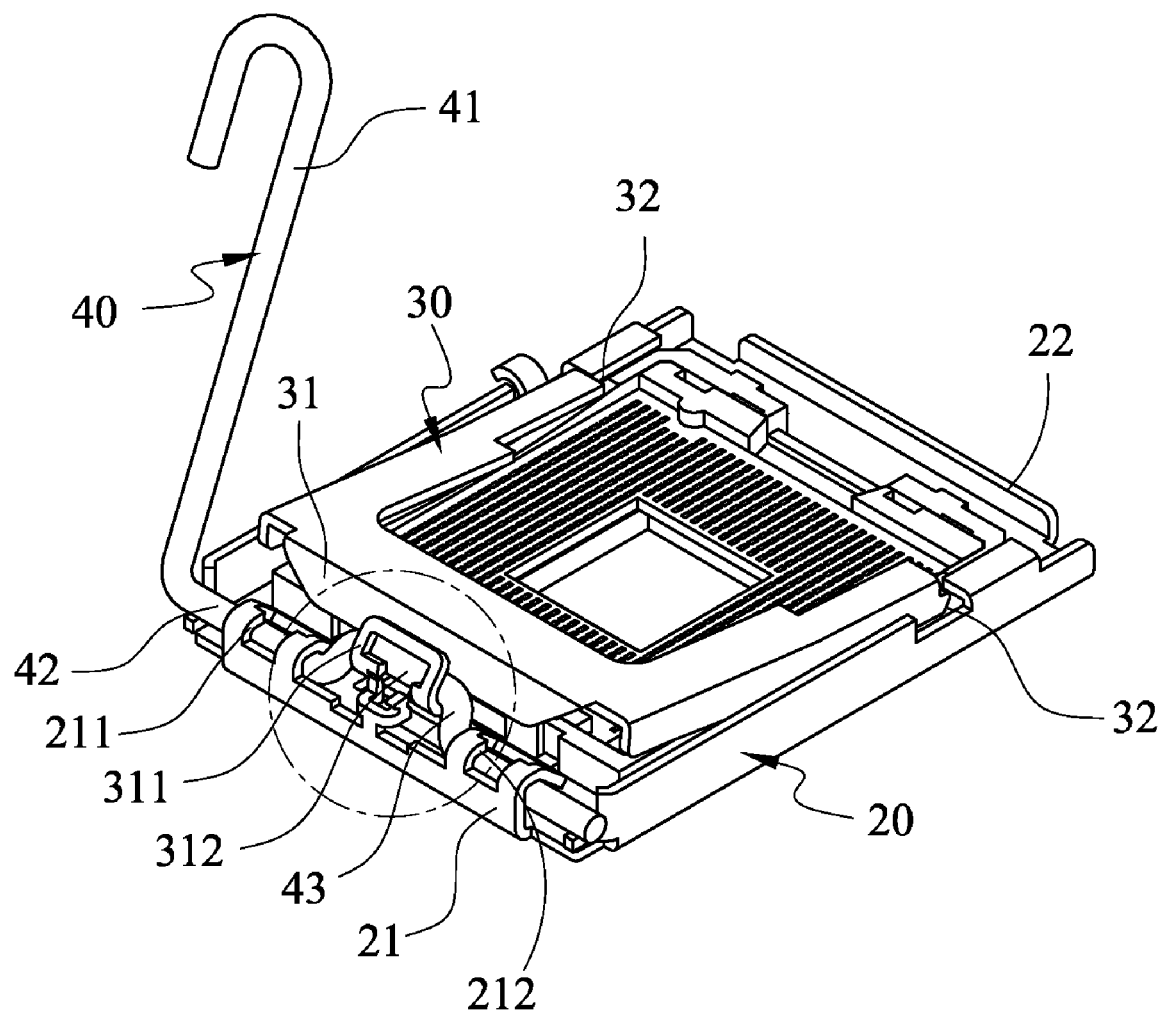
FIG. 2 shows the frame of the LGA IC connector according to the present invention.
Figure 3:
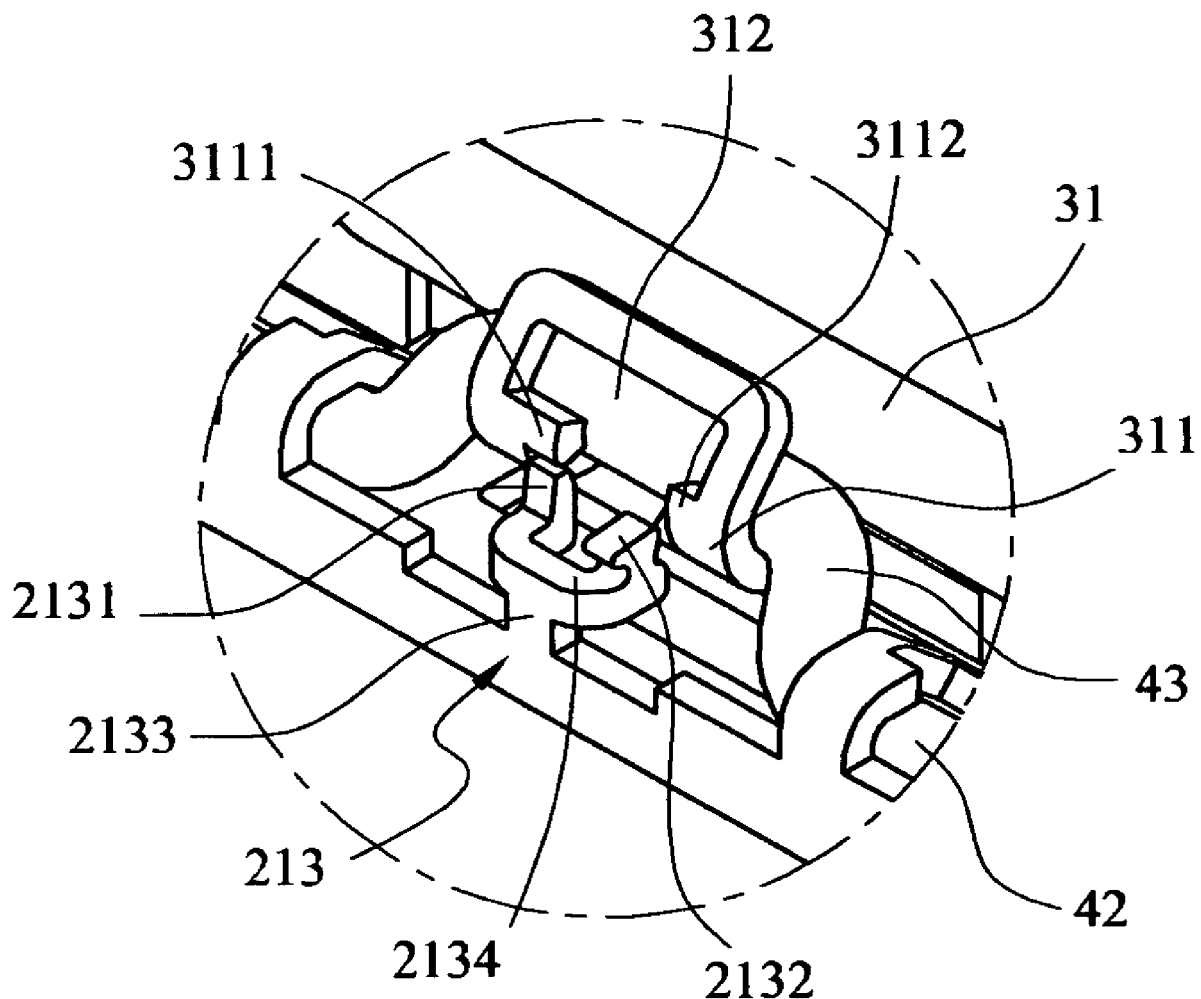
FIG. 3 shows a partially enlarged view of the frame of the LGA IC connector according to the present invention.

As shown in FIGS. 2 and 3, the frame assembly 70 comprises a frame 20, a pressing cover 30 and a pressing rod assembly 40 pivotally connecting the frame 20 and the pressing cover 30, whereby the pressing rod assembly 40 links the pressing cover 30 to move into or outside the frame 20. The frame 20 comprises a first wall 21 and a second wall 22. The first wall 21 comprises a first shaft 211 and a second shaft 212. A positioning section 213 is provided between the first shaft 211 and a second shaft 212. The positioning section 213 comprises a first post 2131 and a second post 2132. The positioning section 213 further comprises a post 2133 formed on the first wall 21 and a U shaped section 2134 formed horizontally on top of the post 2133 such that the first post 2131 and a second post 2132 are arranged on both ends of the U shaped section 2134.

The cover 30 comprises a first end 31 and the first end 31 comprises a third shaft 311 with a first tooth 3111 and a second tooth 3112. The third shaft 311 is capped on the crank 43 of the pressing rod 41, The first tooth 3111 and the second tooth 3112 are corresponding to the first post 2131 and the second post 2132. The third shaft 311 further comprises a hollow 312 with ends corresponding to the first tooth 3111 and the second tooth 3112. When the cover 30 is linked by the pressing rod 40, the first tooth 3111 is abutted to the first post 2131 of the positioning section 213, or the second tooth 2132 is abutted to the second post 3112.

The pressing rod assembly 40 comprises a pressing rod 41, a rod shaft 42 and a crank 43, which are formed integrally. When the pressing rod 41 is operated, the rod shaft 42 and the crank 43 are rotated simultaneously. The rod shaft 42 is arranged in the first shaft 211 and the second shaft 212 of the frame 20 and the third shaft 311 is capped on the crank 43 of the pressing rod assembly 40. When the pressing rod 41 is operated to an opening direction to open the cover 30, the crank 43 of the pressing rod assembly 40 rotates the cover 30 to open the cover 30. On the contrary, when the pressing rod 41 is operated to a closing direction to close the cover 30, the crank 43 of the pressing rod assembly 40 rotates the cover 30 to close the cover 30.

Figure 4:
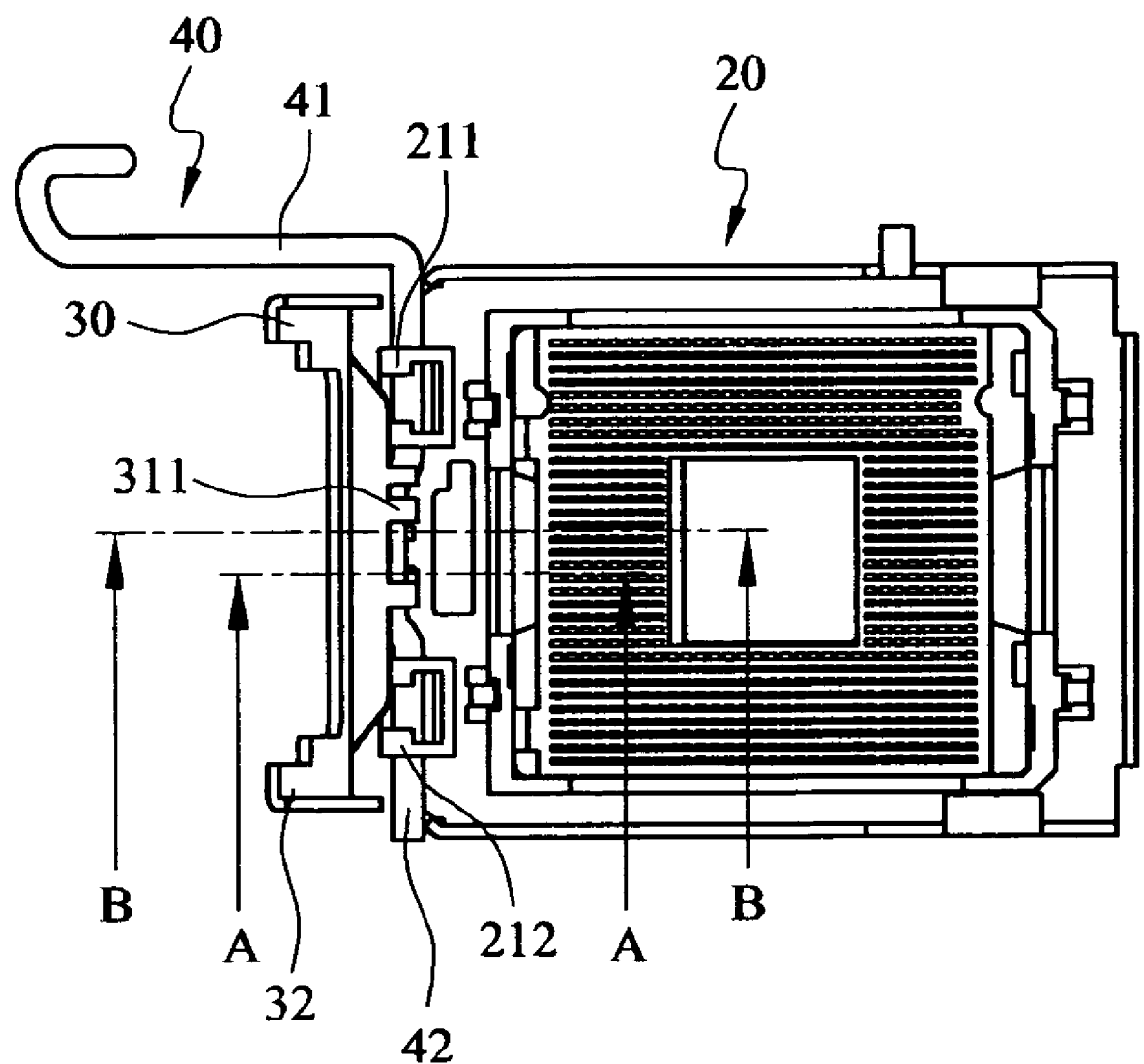
FIG. 4 shows a top view of the LGA IC connector according to the present invention.

FIG. 4 shows a top view of the LGA IC connector according to the present invention along line A—A and line B—B, which are corresponding to two positions.

Figure 5A:
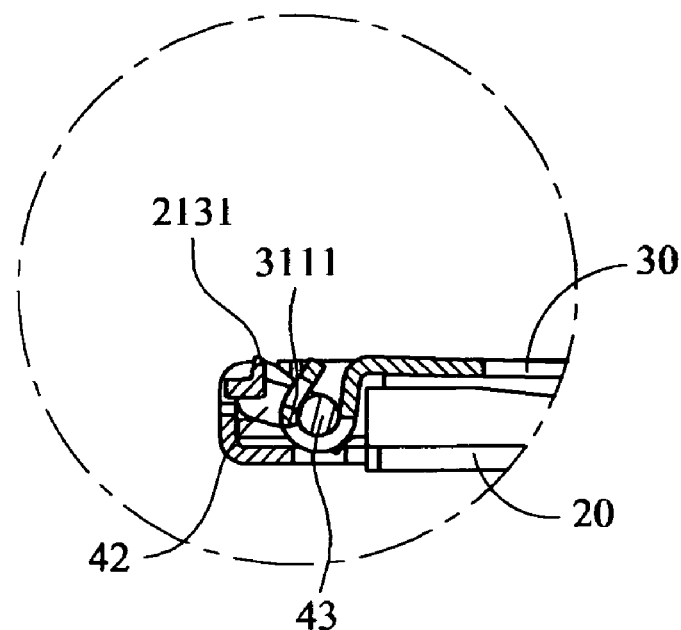
FIG. 5A–FIG. 11B show the operation of the LGA IC connector according to the present invention.
Figure 5B:
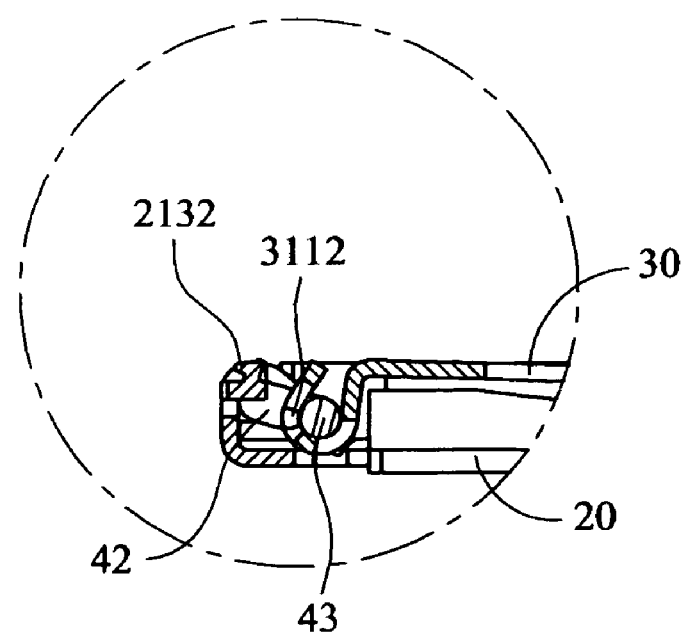

FIG. 5A to FIG. 11B show the operation of the LGA IC connector according to the present invention. As shown in FIGS. 5A and 5B, the cover 30 is closed in the frame 20 and the pressing rod 41 is locked. The first tooth 311 and the first post 2131 are separate, the second tooth 3112 and the second post 2132 are separate.

Figure 6A:
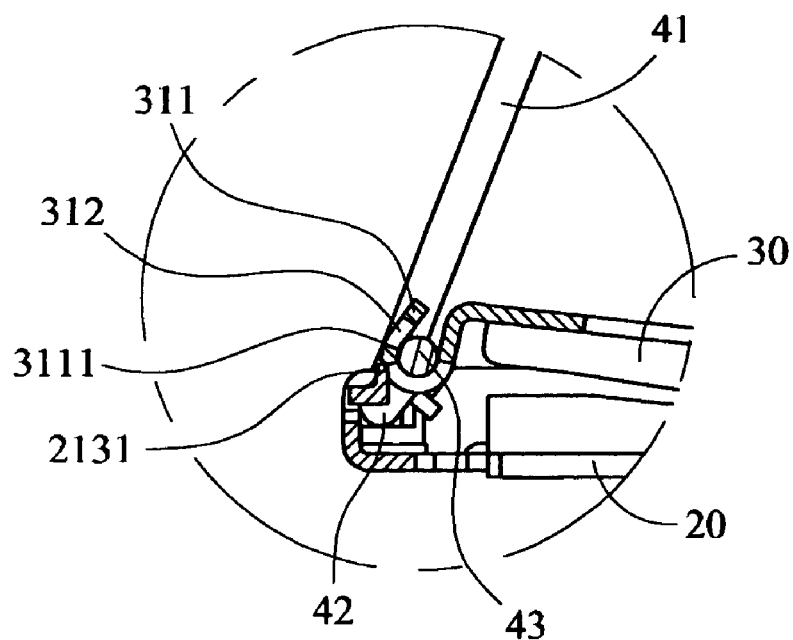
Figure 6B:
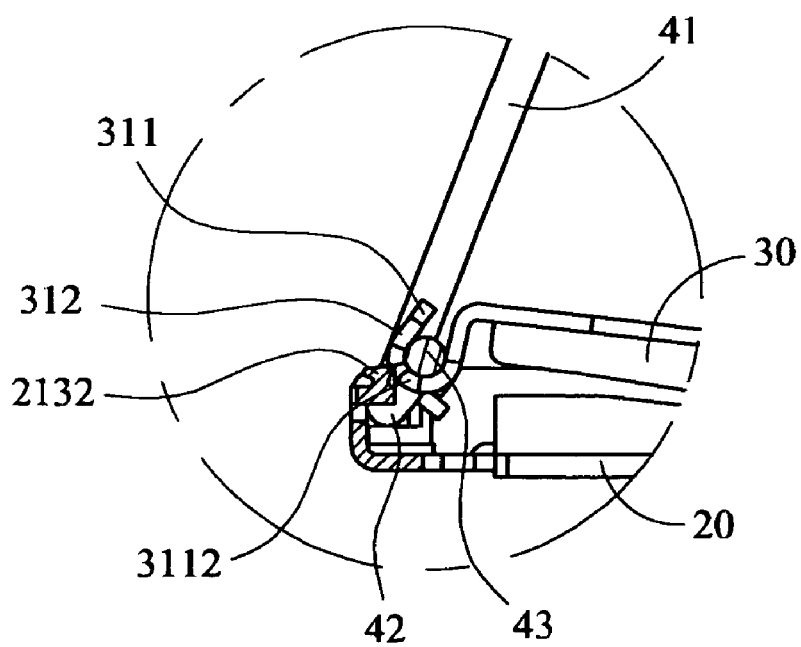

As shown in FIGS. 6A and 6B, the pressing rod 41 is pushed upward and the crank 43 moves the cover 30 in a direction of leaving the ear 24 of the frame 20.

Figure 7A:
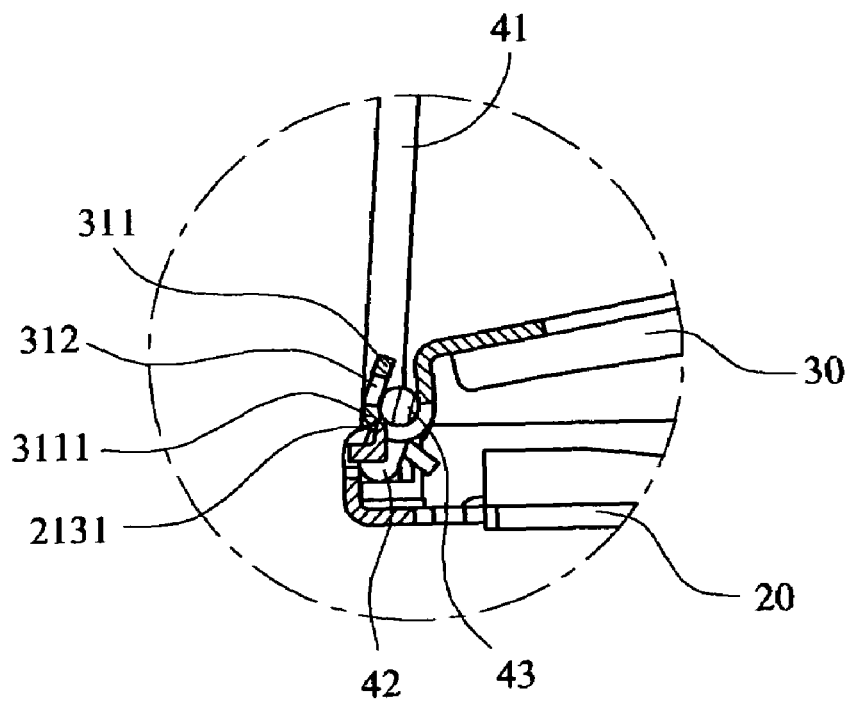
Figure 7B:
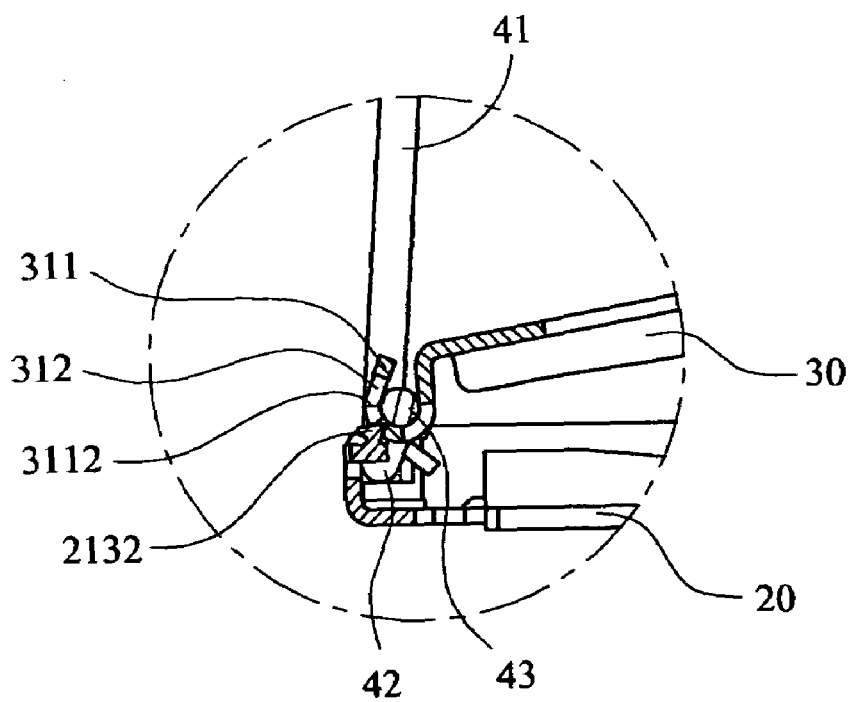

As shown in FIGS. 7A and 7B, when the arm 32 of the cover 30 is away from the ear 24, the cover 30 is moved until the second tooth 3112 of the third shaft 311 of the cover 30 is abutted the second post 2132 of the second frame 20. The cover 30 is subjected to upward force because the rotation of the pressing rod and the second tooth 3112 is abutted to the second post 2132.

Figure 8A:
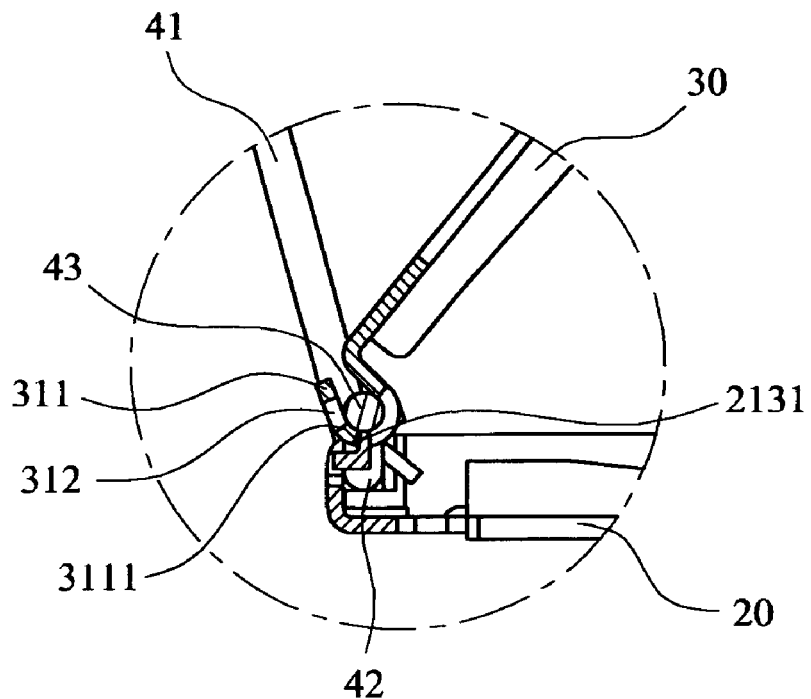
Figure 8B:
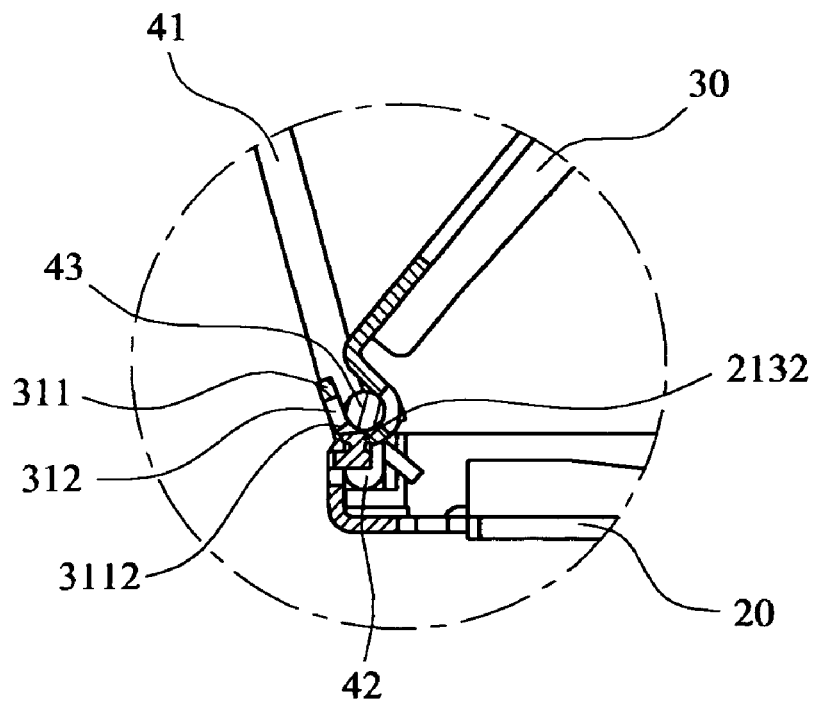

As shown in FIGS. 8A and 8B, the rod shaft 42 rotates further and the second tooth 3112 is moved by the second post 2132, whereby the cover 30 is moved upward in greater extent.

Figure 9A:
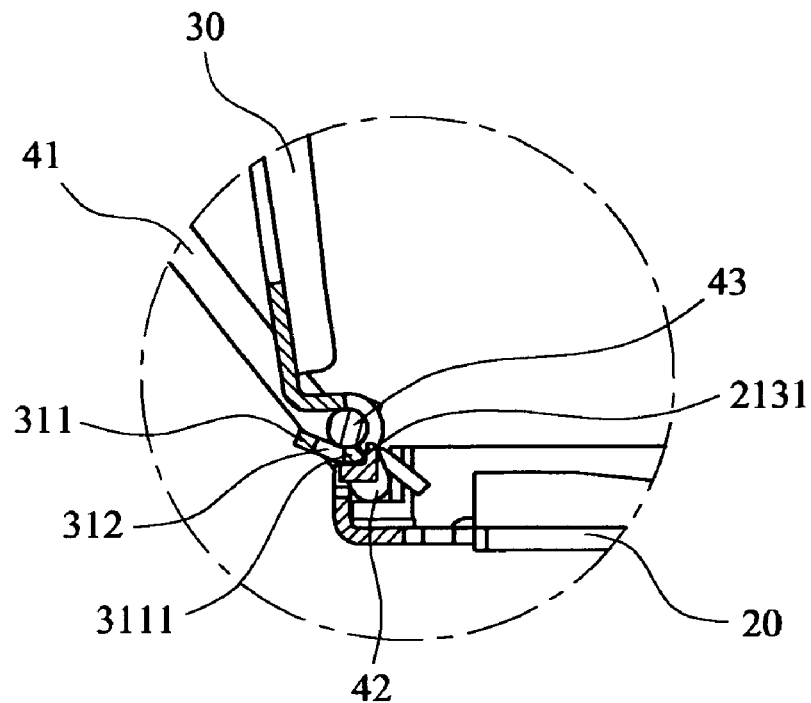
Figure 9B:
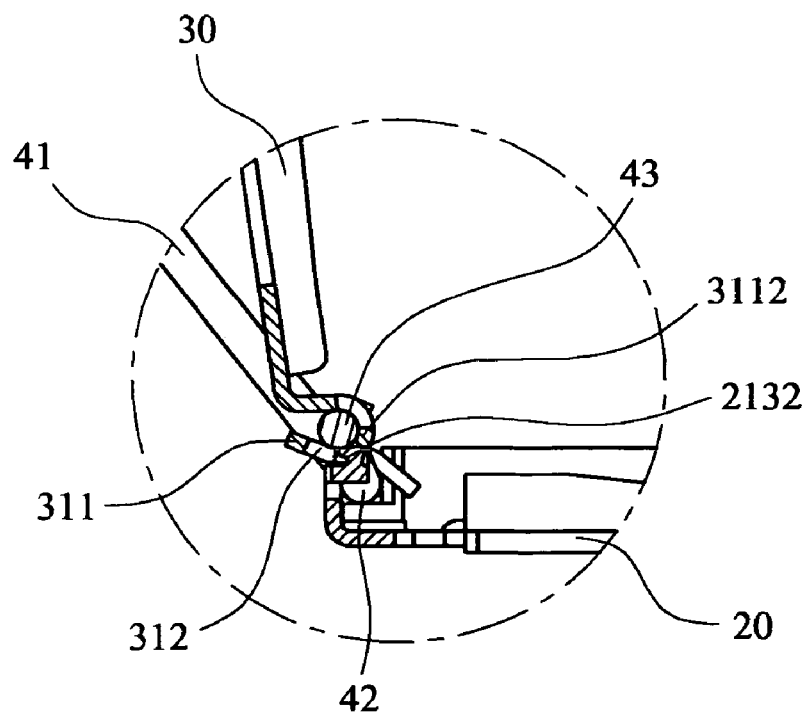
Figure 10A:
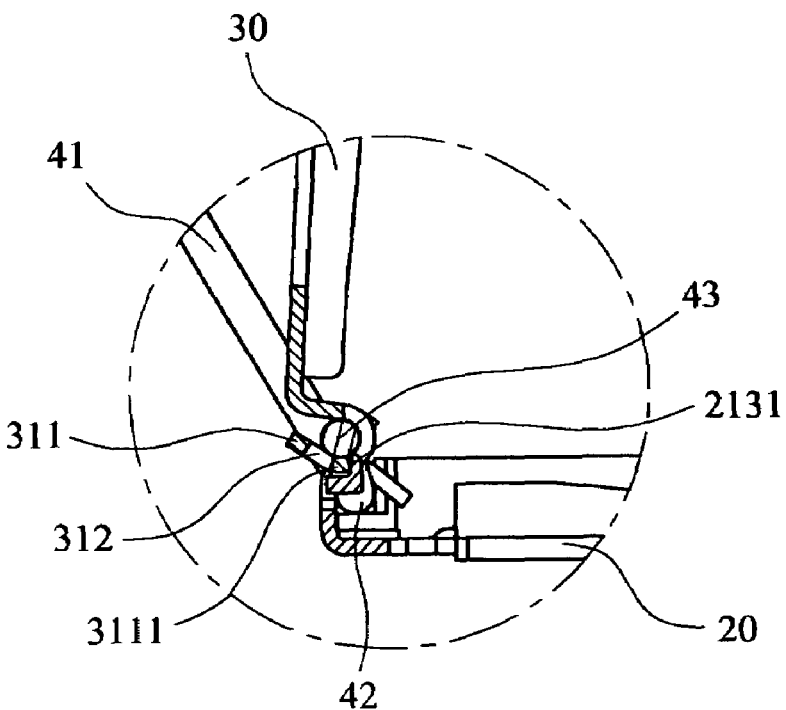
Figure 10B:
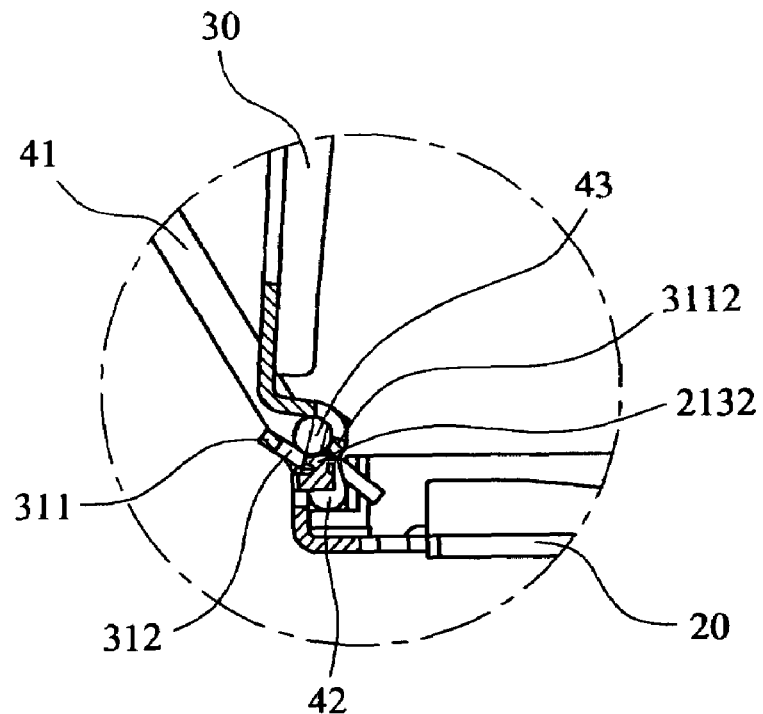
Figure 11A:
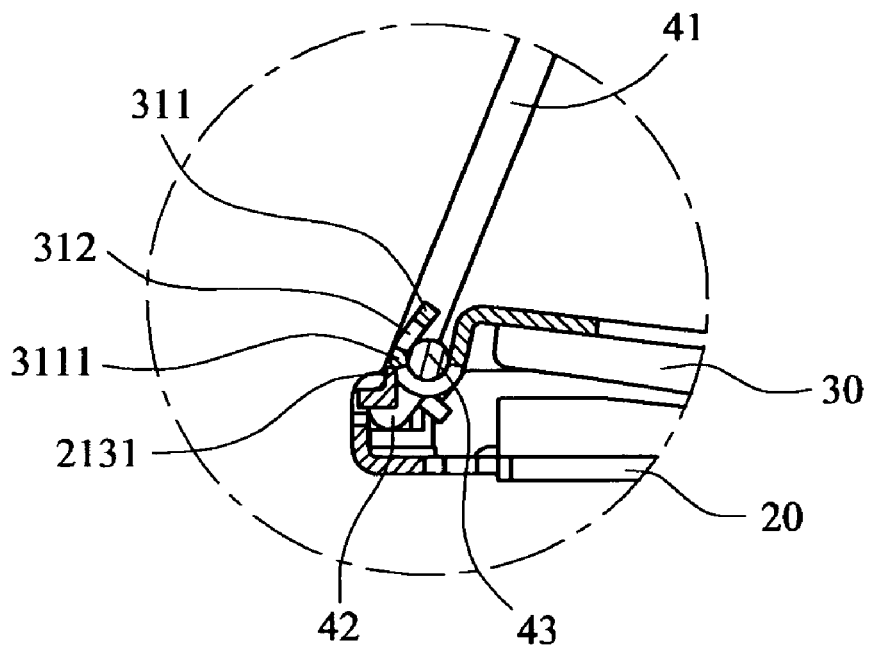
Figure 11B:
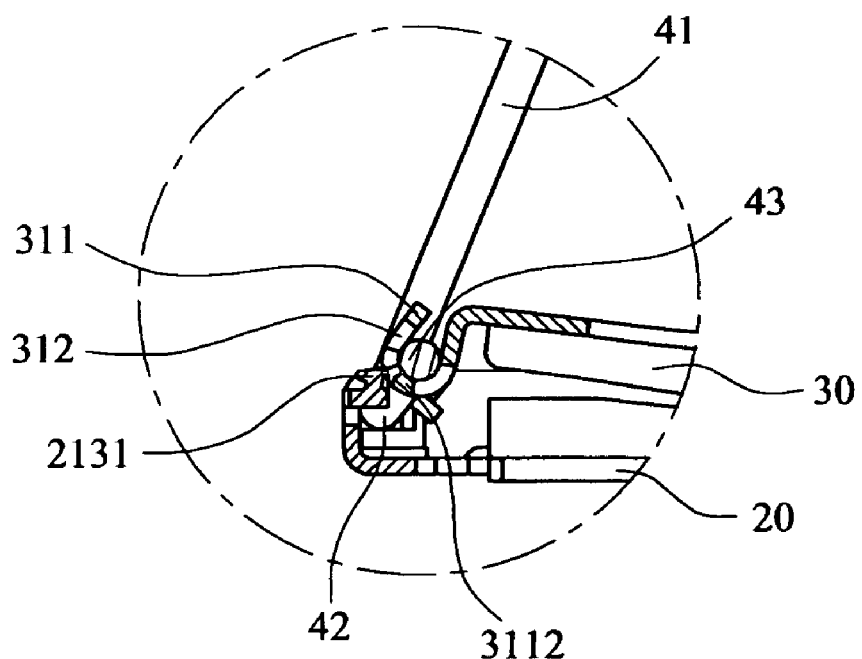

As shown in FIGS. 9A and 9B, when the crank 43 is rotated to abut the top end of the second post 2132, the angle between the cover 30 and the pressing rod is 41 is reduced. The pressing rod 41 has smooth movement, the cover 30 is moved upward in greater extent for facilitating the taking and assembling of the IC while the rotational angle of the pressing rod is not large. The cover 30 and the pressing rod 41 are moved in the same direction when they are opened. Therefore, they will occupy space for installing IC and the IC can be easily installed in the frame 20.

As shown in FIGS. 10A to 11B, after the IC is installed, the cover 30 and the frame 20 are closed. The pressing rod 41 is operated to closing direction and the crank 43 is also rotated. When the crank 43 is rotated, the cover 30 is driven and the first tooth 3111 is abutted against the first post 2131. The first tooth 3111 is moved by the first post 2131 and the cover 30 is moved to closing direction in greater extent and the arm 32 enters the ear 24 and then the first tooth 311 is away from the first post 2131. At this time the pressure of the cover 30 is converted to a force exerted by the crank 43 to the third shaft 311, and the force is exerted to the IC through a force-acting point of the arm 32 and the cover 30 until the pressing rod 41 is capped on the frame 20. A level action with larger pressure by leverage action because the distance between the rod shaft 42 and the crank 43 is shorter than the distance between the rod shaft 42 and the pressing rod 41. The pressing rod 41 needs fewer angles to move the cover 30 to a preparation position for closing; therefore, larger operation angle is reserved for pressure conversion.

Therefore, after the pressing rod 41 releases the pressure over the cover 30 and is away from the ear 24, the cover 30 can be opened in greater extent. Namely, operating the pressing rod 41 can close or open the cover 30 in greater extent, while user only operates in smaller angle.

Figure 12:
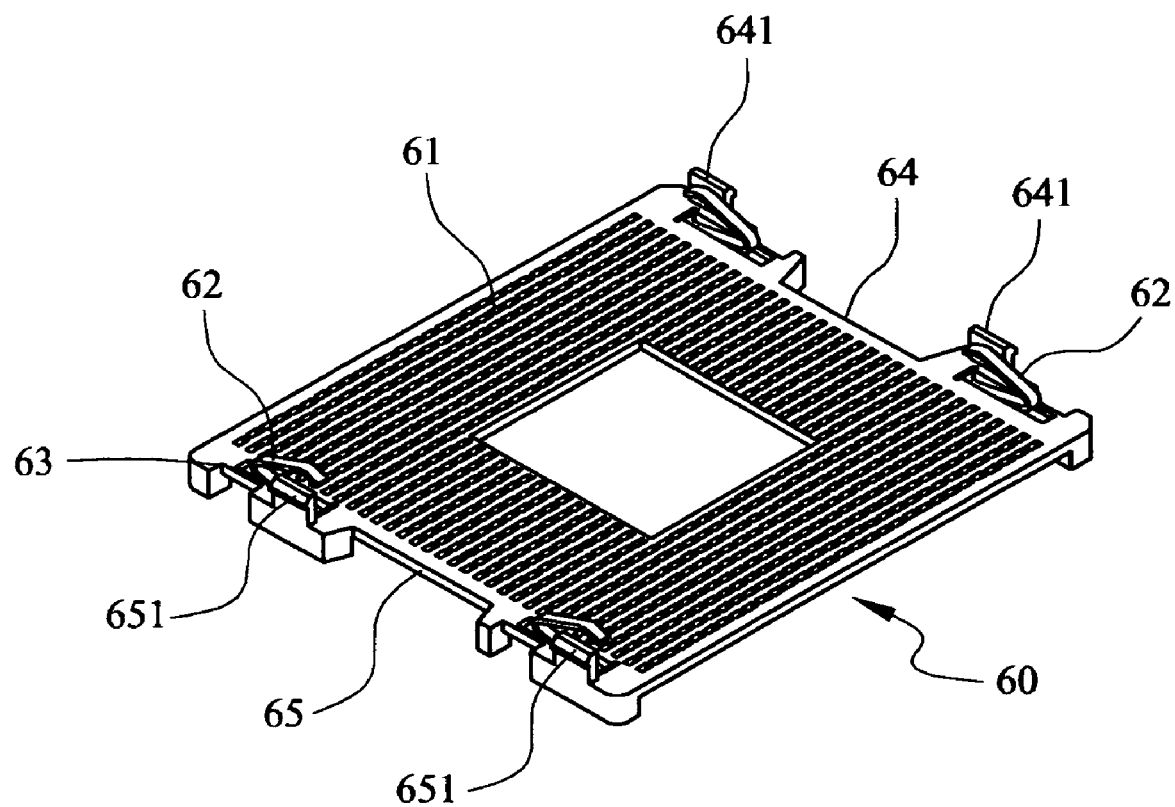
FIG. 12 shows an exploded view of the protection board of the LGA IC connector according to the present invention.
Figure 13:
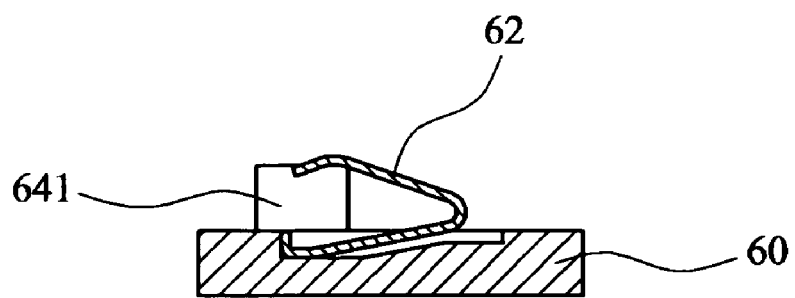
FIG. 13 shows a sectional view of the protection board of the LGA IC connector according to the present invention.

With reference to FIGS. 1, 12 and 13, the IC connector comprises a terminal stage 50 and a protection board 60. The protection board 60 comprises a plurality of through holes 61 and a plurality of dents 63 and the free end of the terminal 52 is movably protected in the through hole 61. The protection board 60 comprises a first end wall 64 and a second end wall 65. The first end wall 64 and the second end wall 65 comprise two tenons 641 and 651 locked to locking dents 56 of the terminal stage 50, whereby the protection board 60 provides movement confinement with the terminal stage 50. Each of the dents 63 in the protection board 60 is corresponding to one adjacent tenon 641 (651).

The tenon 641, 651 and the locking dent 56 are provided between the terminal stage 50 and the protection board 60, and spring element 62 is provided among the tenon 641, 651 and the locking dent 56. The spring element 62 is of V shape and the upward force is blocked by the tenon 641, 651. When the protection board 60 is lifted by the spring element 62, the acting force is around the tenon 641, 651 and it will not cause the deform of the protection board 60 due to overheat. The spring element 62 is of V shape with symmetry in vertical direction. Therefore, the protection board 60 has smooth face and good resilience over the terminal stage 50 in order to protect the terminal. In this preferred embodiment, a single protection board 60 is provided for the terminal stage 50. Moreover, two protection boards 60 can be provided on the upper and lower faces of the terminal stage 50 to protect two free ends of the terminal 52.

Figure 14:
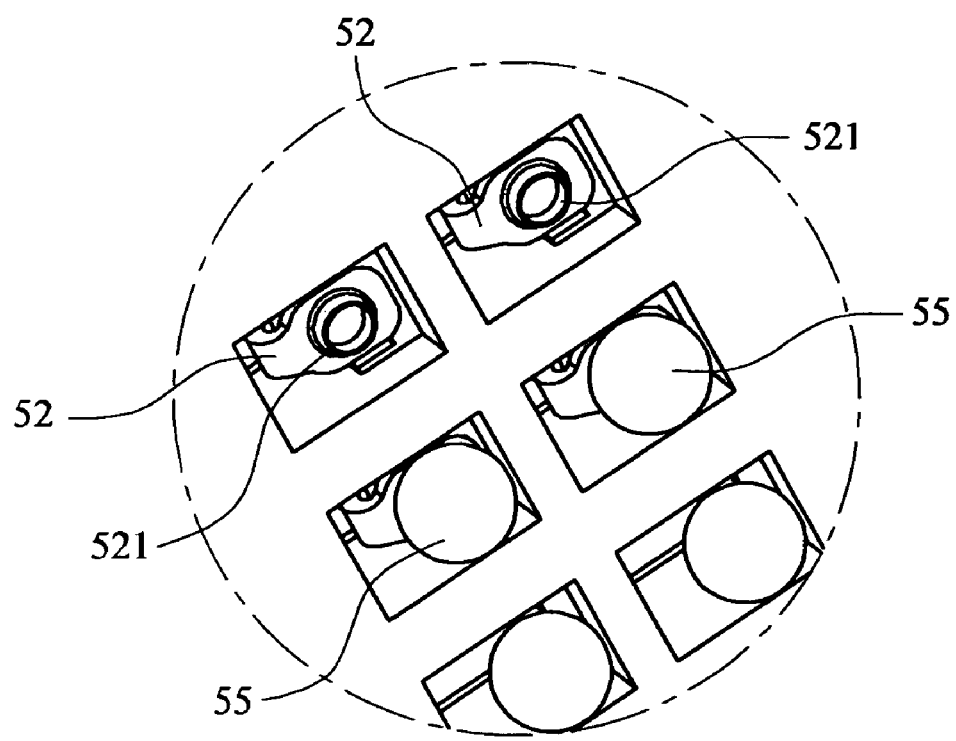
FIG. 14 shows a top view of the protection board of the LGA IC connector according to the present invention.
Figure 15:
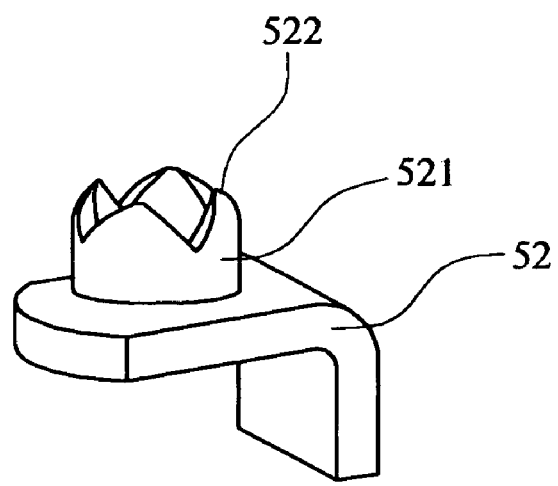
FIG. 15 shows the annular cone of the terminal of the LGA IC connector according to the present invention.

As shown in FIGS. 14 and 15, the terminal stage 50 comprises a plurality of terminal holes 51 and each of the terminal holes contains a terminal 52. The terminal 52 comprises an annular cone 521 at soldering end thereof and the tin ball 55 can be stabbed by the conic tooth 522 and the annular cone 521 when the tin ball 55 is assembled. The opening of the annular cone 521 is shrunk to clamp the tin ball 55. As shown in FIG. 15, a plurality of conic teeth 522 are arranged on the annular cone 521 for stabbing into the solder ball 55 and clamping the solder ball 55.

Figure 16:
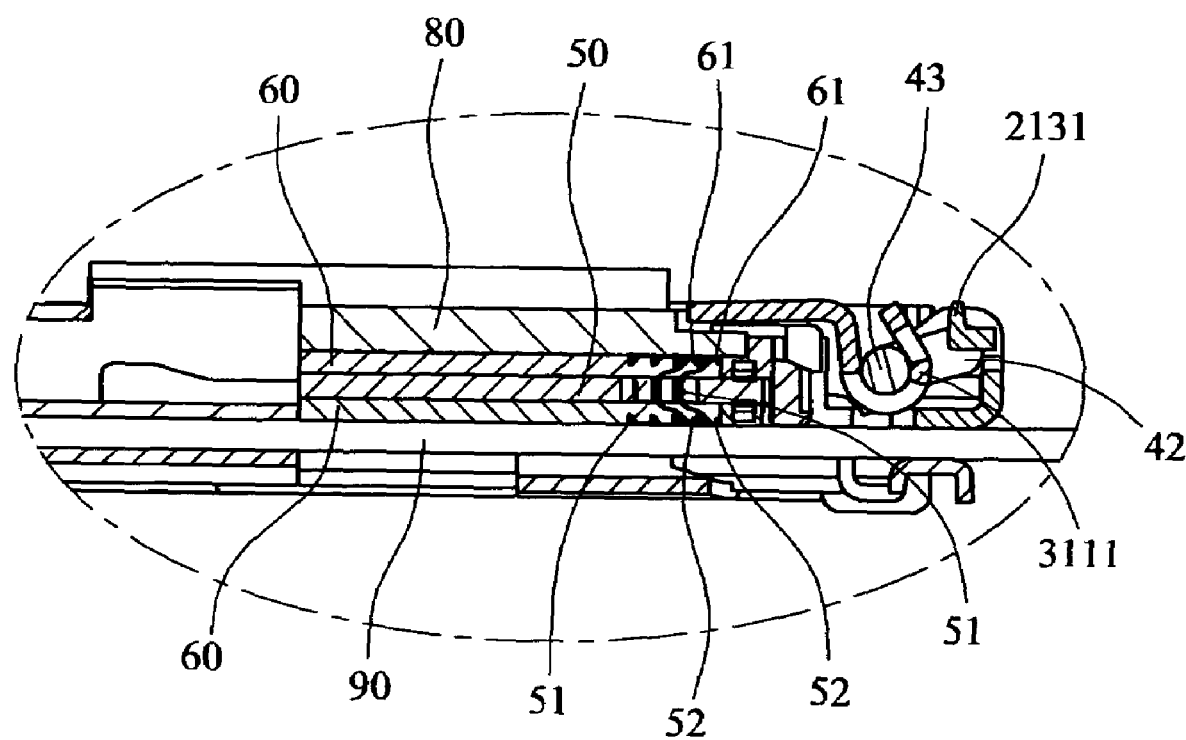
FIGS. 16 and 17 show the operation of the terminal of the LGA IC connector according to the present invention.
Figure 17:
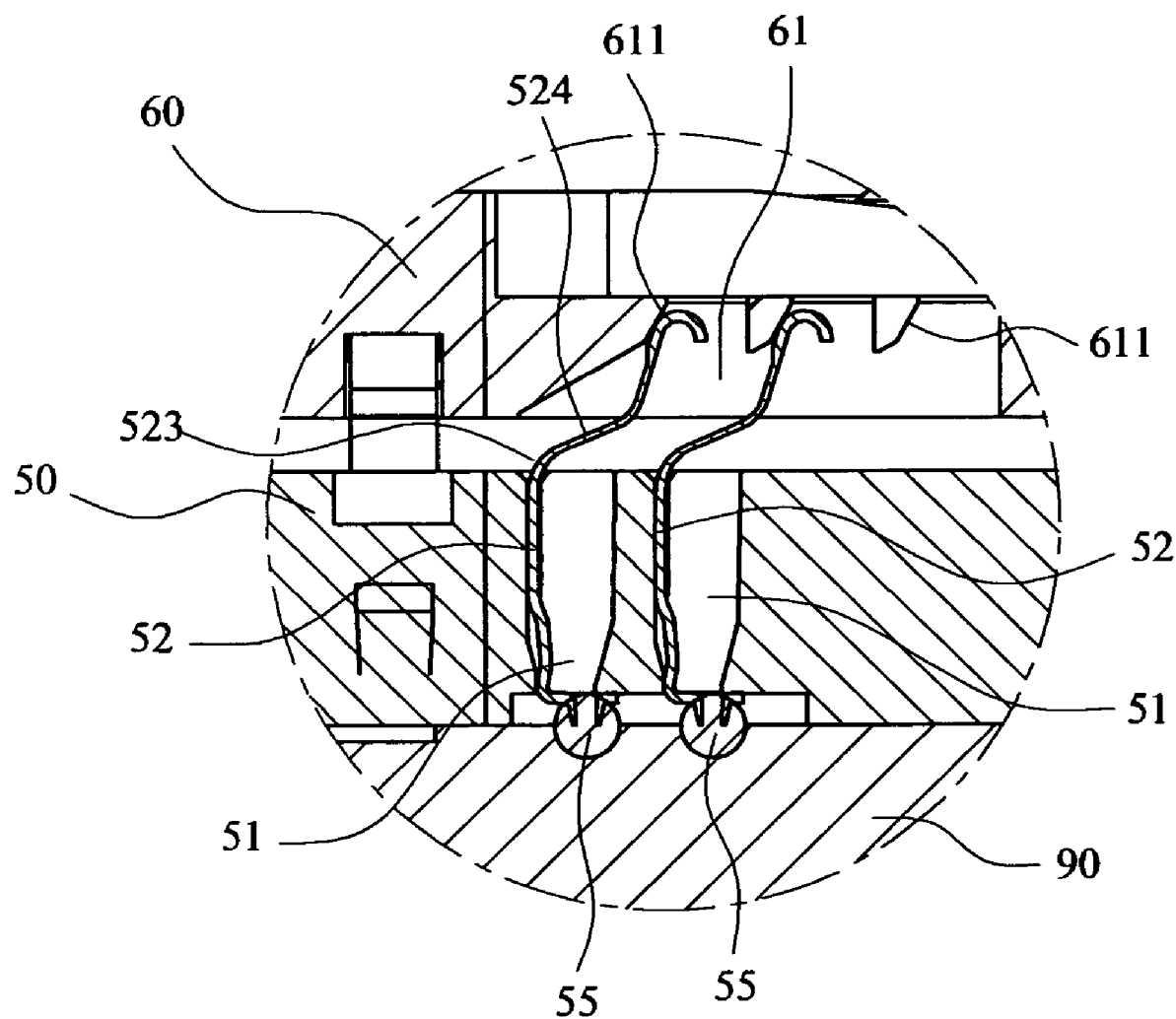
Figure 18:
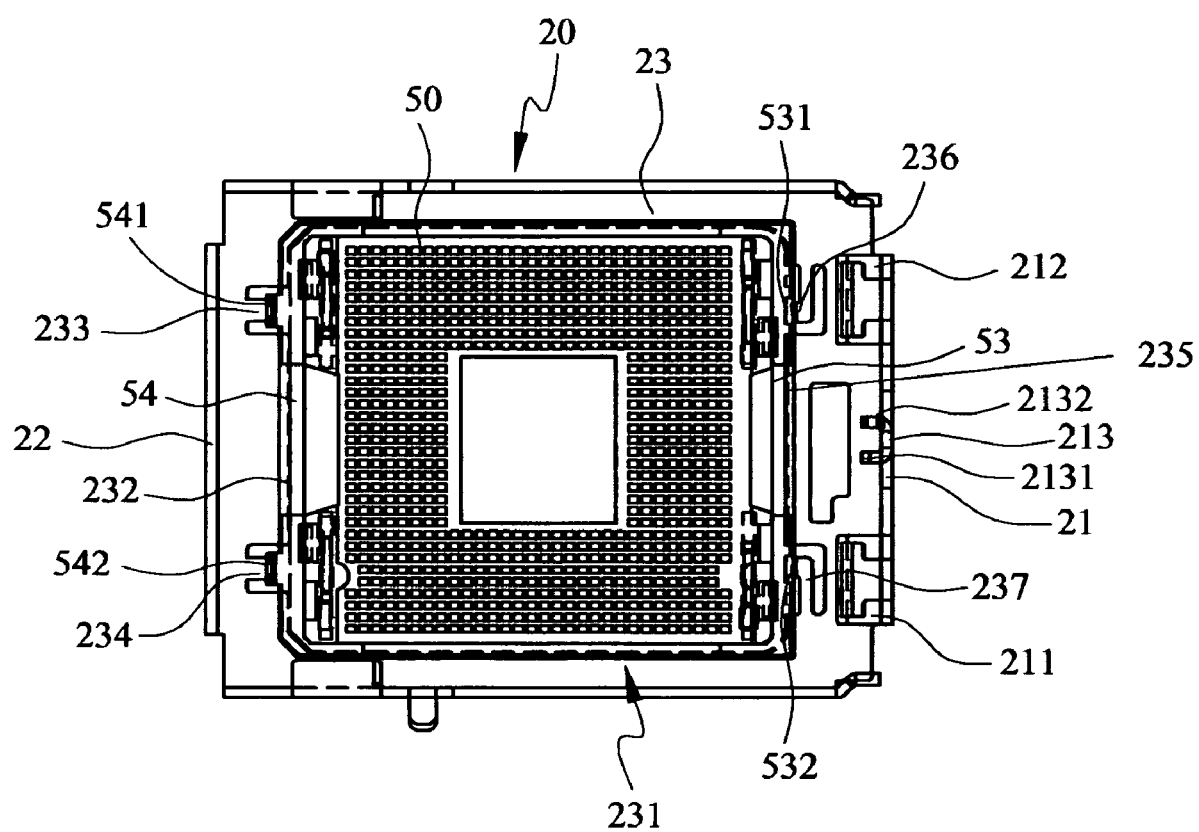
FIG. 18 shows a top view of the terminal assembled with frame.
Figure 19:
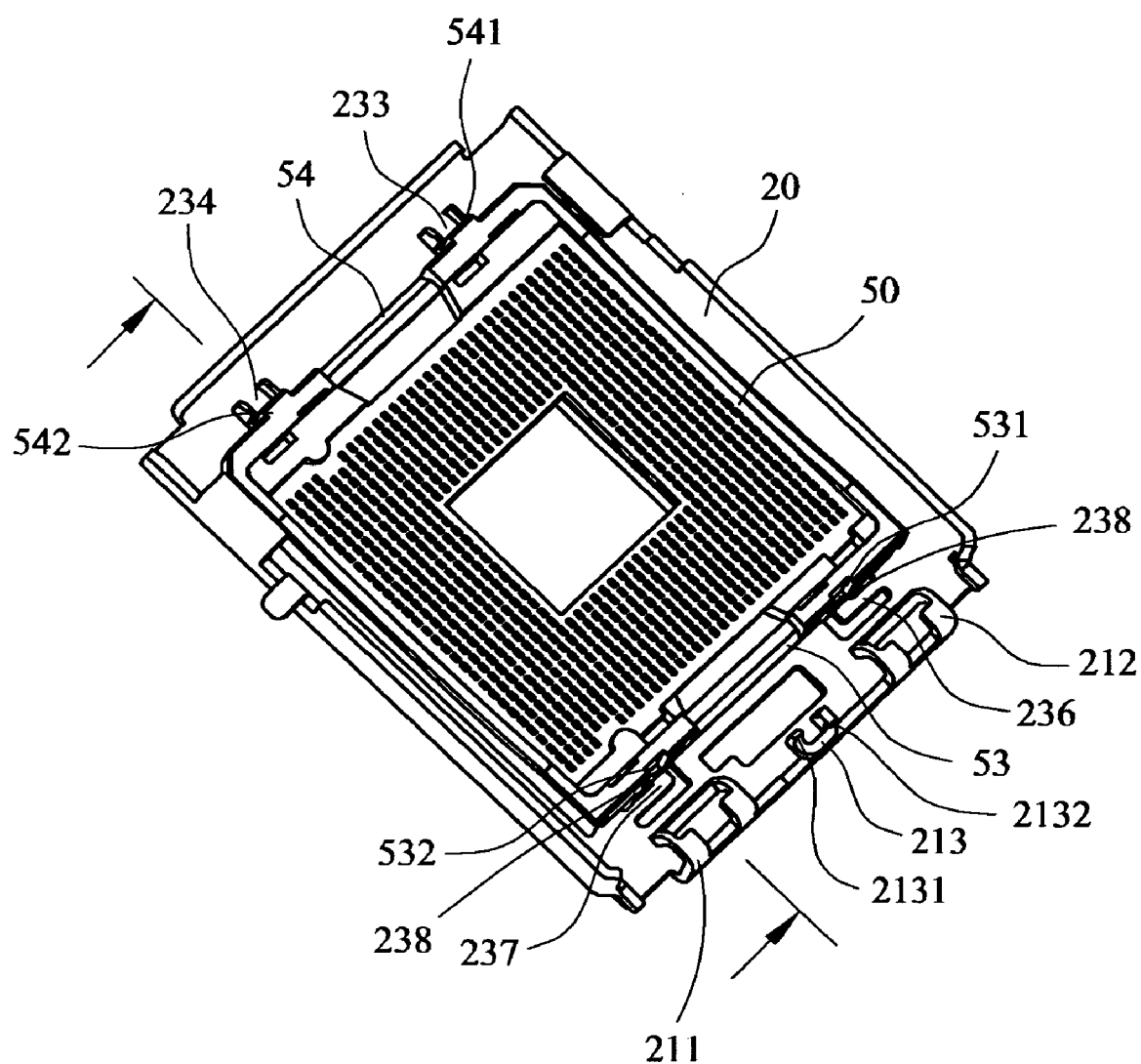
FIG. 19 shows a perspective view of the terminal assembled with frame.
Figure 20:
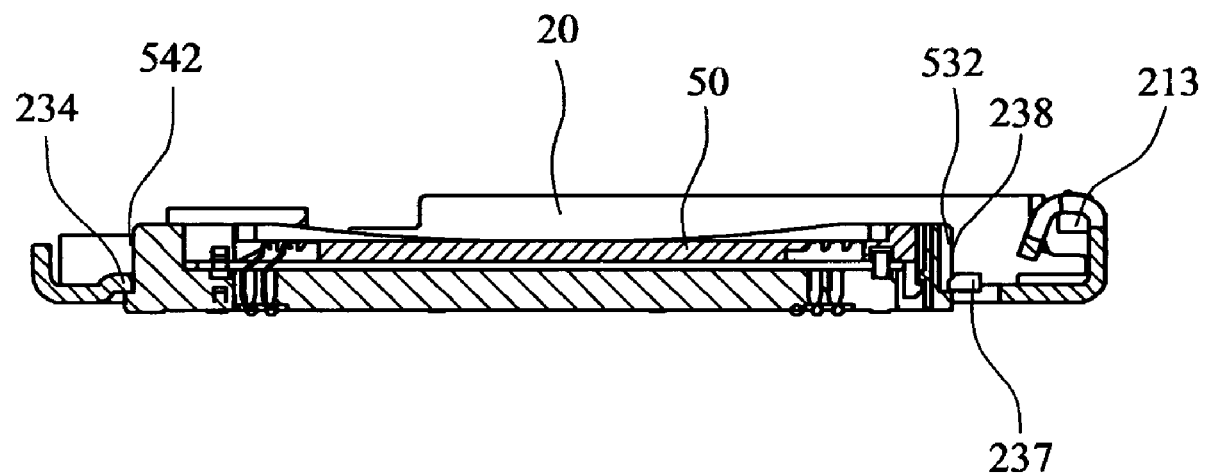
FIG. 20 shows a sectional view of FIG. 19.
Figure 21:
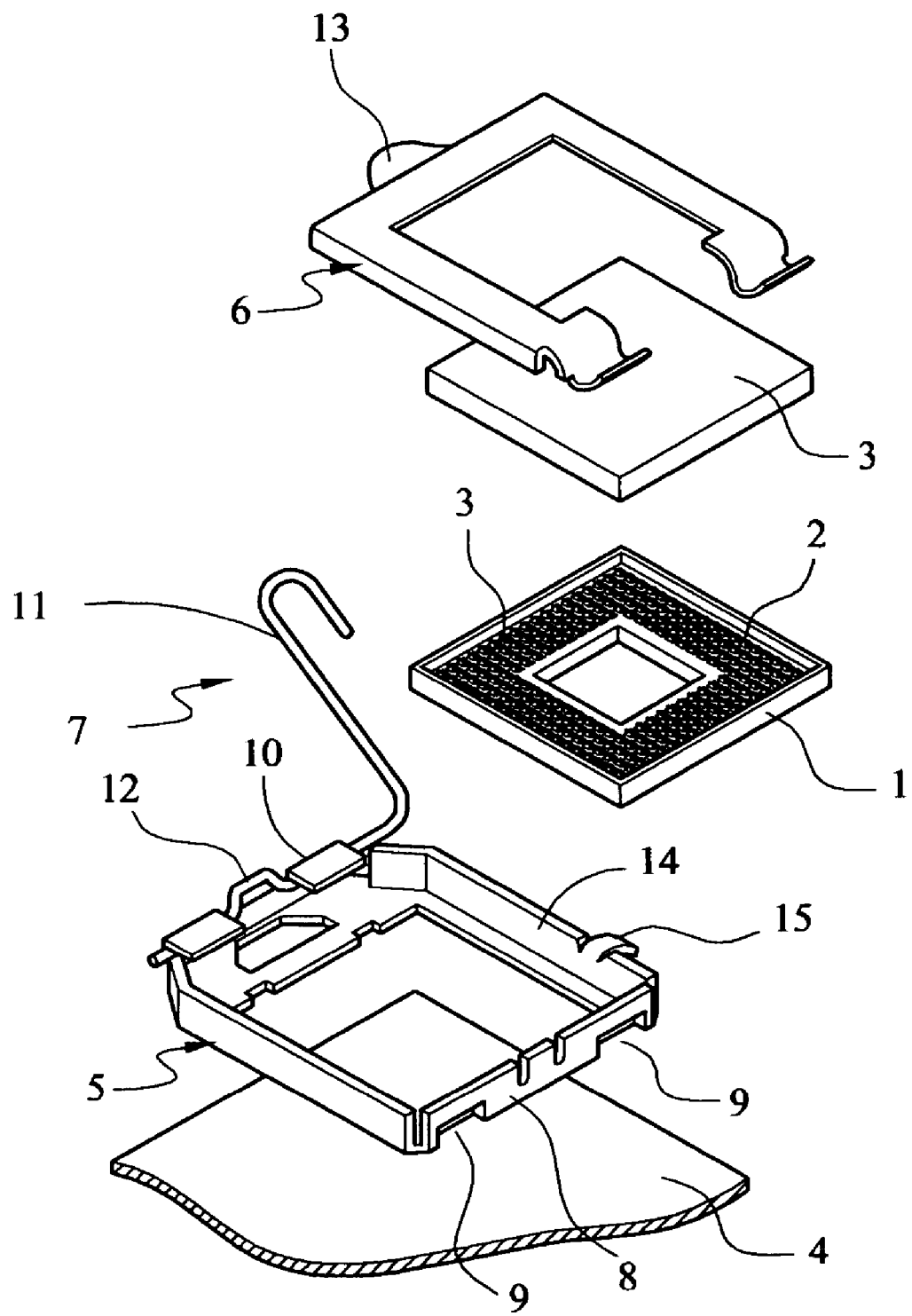
FIG. 21 shows an exploded view of a prior art LGA IC connector.

With reference to FIGS. 16 and 17, when the IC 80 is assembled to the protection board 60, the pressing rod 41 is operated to move the cover 30 for pressing the IC 80. The protection board 60 is pressed downward by the IC 80 and the V-shaped spring element 62 is compressed. The spring end of the terminal 52 is guided by a guiding bevel 611 of the protection board 60 to extend out of the protection board 60 and contacting the IC 80. The terminal 52 also extends out of the protection board 60 for contacting the circuit board 90.

On the contrary, the pressing rod 41 is pushed upward, the pressure of the terminal 52 and the protection board 60 can be released. The protection board 60 pushes the IC to a place higher than top of the terminal 52 to remove the IC without the risk of damaging the terminal 52. The terminal 52 is shrunk in the through hole 6 and the pressure force released by the V-shaped spring element 62 pushes the protection board 60 away from the terminal stage 50. The terminal 52 is shrunk in the through hole 61 and is not in contact with the circuit board 90. The terminal 52 can be protected from exposing. A swing portion of the terminal 52 comprises a thin section 524 and a tapered section 523 to increase the swing thereof without increasing the length of the swing portion.

With reference to FIGS. 1, 18, 19 and 20, the terminal stage 50 comprises a first wall 53 and a second wall 54. The first wall 53 comprises a first clamping groove 531 and a second clamping groove 532. The second wall 54 comprises a third clamper 541 and a fourth clamper 542, wherein third clamper 541 and the fourth clamper 542 can be realized by a hook or a clamping groove and is hook in this preferred embodiment. The frame 20 comprises a first wall 21, a second wall 22 and a bottom plate 23. A first shaft 211 and a second shaft 212 are formed on the first wall 21. The bottom plate 23 comprises a hollow 231, and a first locker 233 and a second locker 234 are formed on the first end 232 of the hollow 231.

The hollow 231 comprises a third locker 236 and a fourth locker 237 at the second end 235 thereof. After the cover 30 is opened, the terminal stage 50 is placed in the frame 20. During assembling, the third clamper 541 and the fourth clamper 542 are firs horizontally aligned with the first locker 233 and the second locker 234. The first clamping groove 531 and the second clamping groove 532 are then pressed along the guiding bevel 238 of the third locker 236 and the fourth locker 237.

The locking points of the lockers 223, 224, 236 and 237 have a height difference with respect to the bottom plate 23 of the frame 20. Therefore, the thickness and strength of the first clamping groove 531 and the second clamping groove 532 and the third clamper 541 and the fourth clamper 542, while the third locker 236 and the fourth locker 237 have elastic horizontal swing. The guiding bevel 238 of the third locker 236 and the fourth locker 237 facilitate the terminal stage 50 to fit into the frame 20. The first locker 233, the second locker 234, the third locker 236 and the fourth locker 237 outwardly extend from the bottom plate 23.

To sum up, the present invention provides smooth operation between the pressing rod assembly and the cover and the angular change between the cover and the pressing rod. The opening/closing angle of the cover can be facilitated. The operation for the terminal stage and the frame are simplified and the solder ball of the terminal can be clamped by terminal tail.

Although the present invention has been described with reference to the preferred embodiment thereof, it will be understood that the invention is not limited to the details thereof. Various substitutions and modifications have suggested in the foregoing description, and other will occur to those of ordinary skill in the art. Therefore, all such substitutions and modifications are intended to be embraced within the scope of the invention as defined in the appended claims.

What is claimed is:

1. An integrated circuit (IC) connector, comprising
a frame comprising a first wall and a second wall, the first wall comprising a first sleeve and a second sleeve, a positioning section provided between the first sleeve and the second sleeve and comprising a first post and a second post;
a cover comprising a first end with a receiving pivot and the receiving pivot comprising a first tooth and a second tooth; and
a pressing rod assembly comprising a pressing rod, a rod shaft arranged in the first and the second sleeves and a crank capped by the receiving pivot, such that when the pressing rod is operated to an open or a close direction the crank rotates the cover to open or close.

2. The IC connector as in claim 1, wherein the positioning section further comprises a post formed on the first wall, a U shaped section is horizontally formed on top of the post, the first post and second post being arranged on both sides of the U shaped section, wherein the receiving pivot further comprises a hollow and the first tooth and the second tooth are arranged on opposite ends of the hollow such that the first tooth is corresponding to the first post and the second tooth is corresponding to the second post.

3. An integrated circuit (IC) connector, comprising:
a terminal stage comprising a plurality of terminal holes, a first wall and a second wall, the first wall comprising a first clamping groove and a second clamping groove, the second wall comprising a third clamper and a fourth clamper;

a frame comprising a first wall and a second wall, and a bottom plate, the first wall comprising a first sleeve and a second sleeve, the bottom plate comprising a hollow and a first locker and a second locker being arranged at a first end of the hollow, a third locker and a fourth locker being formed at a second end of the hollow, such that when the terminal stage is fixedly mounted in the frame by engaging the third and the fourth clampers and the first and second clamping grooves with the first, the second, the third and the fourth lockers, respectively, a cover comprising a first end with a receiving pivot; and a pressing rod assembly comprising a pressing rod, a rod shalt arranged in the first and the second sleeves and a crank capped by the receiving pivot, such that when the pressing rod is operated to an open or a close direction the crank rotates the cover to open or close.

4. The IC connector as in claim 3, wherein the first locker, the second locker, the third locker and the fourth locker outwardly extend from the bottom plate.

5. The IC connector as in claim 3, wherein the third locker and the fourth locker parallel extend from the second end of the bottom plate, and each of the third locker and the fourth locker comprises a bevel.

6. A land grid array integrated circuit (LGA IC) connector, comprising:

a protection board comprising a plurality of dents;

a plurality of spring elements arranged on the dents; and a terminal stage comprising a plurality of terminal holes and containing terminals therein;

wherein the protection board is arranged in the terminal stage such that the spring elements are placed between the protection board and the terminal stage, and wherein the protection hoard comprises a first end wall and a second end wall, the first end wall and the second end wall comprise two tenons for locking into locking dents of the terminal stage.

7. The LGA IC connector as in claim 6, wherein the dent is placed beside the tenon.

8. The LGA IC connector as in claim 6, wherein the spring element is of V shape.

9. The LGA IC connector as in claim 6, wherein the protection board comprises a plurality of through hales and each through hole comprises a guiding bevel.

10. The LGA IC connector as in claim 6, wherein the terminal comprises a swing portion with a thin section and a tapered section.

* * * * *